(12) United States Patent
Fujisato et al.

(10) Patent No.: US 9,324,600 B2
(45) Date of Patent: Apr. 26, 2016

(54) MOUNTING TABLE STRUCTURE AND PLASMA FILM FORMING APPARATUS

(75) Inventors: Toshiaki Fujisato, Nirasaki (JP); Shiro Hayashi, Nirasaki (JP); Hiroyuki Yokohara, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 763 days.

(21) Appl. No.: 13/497,937

(22) PCT Filed: Sep. 21, 2010

(86) PCT No.: PCT/JP2010/066319
§ 371 (c)(1),
(2), (4) Date: Mar. 23, 2012

(87) PCT Pub. No.: WO2011/037107
PCT Pub. Date: Mar. 31, 2011

(65) Prior Publication Data
US 2013/0001076 A1 Jan. 3, 2013

(30) Foreign Application Priority Data
Sep. 24, 2009 (JP) ................................ 2009-218381

(51) Int. Cl.
*C23C 14/34* (2006.01)
*H01L 21/683* (2006.01)
(Continued)

(52) U.S. Cl.
CPC .......... *H01L 21/6831* (2013.01); *C23C 14/358* (2013.01); *C23C 14/50* (2013.01); *H01J 37/321* (2013.01); *H01J 37/32577* (2013.01); *H01J 37/3405* (2013.01)

(58) Field of Classification Search
CPC ..... C23C 14/50; C23C 14/358; H01J 37/321; H01J 37/32577; H01J 37/3405; H01L 21/6831

USPC .......... 204/298.06, 298.15, 298.08; 118/723, 118/500
See application file for complete search history.

(56) References Cited

U.S. PATENT DOCUMENTS 3,763,031 A * 10/1973 Scow et al. .............. 204/298.08
4,131,533 A * 12/1978 Bialko et al. ............. 204/298.14
(Continued)

FOREIGN PATENT DOCUMENTS

CN 101500370 A 8/2009
JP 06-236858 A 8/1994
(Continued)

OTHER PUBLICATIONS

Translation to Suzuki (JP 2006-148075 A1) published Jun. 2006.*
(Continued)

*Primary Examiner* — John Brayton
(74) *Attorney, Agent, or Firm* — Pearne & Gordon LLP

(57) ABSTRACT

A mounting table structure includes a mounting table body, made of a conductive material, for mounting thereon the processing target object and serving as an electrode; a base table, made of a conductive material, disposed below the mounting table body with a gap therebetween in a state insulated from the mounting table body; a support column, connected to the ground side, for supporting the base table; a high frequency power supply line, connected to the mounting table body, for supplying a high frequency bias power to the mounting table body; and a power stabilization capacitor provided between the ground side and a hot side to which the high frequency bias power is applied. Here, an electrostatic capacitance of the power stabilization capacitor is set to be larger than an electrostatic capacitance of a stray capacitance between the mounting table body and the protective cover member.

3 Claims, 6 Drawing Sheets

(51) Int. Cl.
*C23C 14/35* (2006.01)
*C23C 14/50* (2006.01)
*H01J 37/32* (2006.01)
*H01J 37/34* (2006.01)

(56) References Cited

U.S. PATENT DOCUMENTS

| | | | |
|---|---|---|---|
| 5,092,978 A * | 3/1992 | Kojima et al. | 204/298.15 |
| 5,478,429 A | 12/1995 | Komino et al. | |
| 6,423,192 B1 | 7/2002 | Wada et al. | |
| 2008/0141942 A1 | 6/2008 | Brown et al. | |
| 2008/0200002 A1 | 8/2008 | Suzuki et al. | |
| 2008/0241016 A1 | 10/2008 | Kato et al. | |
| 2009/0014323 A1 * | 1/2009 | Yendler et al. | 204/298.33 |
| 2009/0194023 A1 | 8/2009 | Tamura | |

FOREIGN PATENT DOCUMENTS

| | | | |
|---|---|---|---|
| JP | 08-078346 A | | 3/1996 |
| JP | 2001-192824 A | | 7/2001 |
| JP | 2006-014807 A | | 1/2006 |
| JP | 2006148075 A | * | 6/2006 |
| JP | 2007-180596 A | | 7/2007 |
| JP | 2009-182140 A | | 8/2009 |
| WO | 2009/096095 A1 | | 8/2009 |

OTHER PUBLICATIONS

International Search Report for PCT/JP2010/066319 dated Nov. 22, 2010.

* cited by examiner

MOUNTING TABLE STRUCTURE AND PLASMA FILM FORMING APPARATUS

CROSS-REFERENCE TO RELATED APPLICATION

This Application is a U.S. national phase application under 35 U.S.C. §371 of PCT Application No. PCT/JP2010/066319 filed on Sep. 21, 2010, which claims the benefit of Japanese Patent Application No. 2009-218381 filed on Sep. 24, 2009, the entire disclosures of which are incorporated herein by reference.

TECHNICAL FIELD

The present disclosure relates to a plasma film forming apparatus that forms a metal film on a processing target object such as a semiconductor wafer by a plasma sputtering method, and also relates to a mounting table structure used for the plasma film forming apparatus.

BACKGROUND ART

Generally, when manufacturing a semiconductor device, various processes such as a film forming process and a pattern etching process are repeatedly performed on a semiconductor wafer to obtain a desired device. Especially, in order to fill a recess on the semiconductor wafer or in order to form a wiring pattern on the semiconductor wafer, a thin metal film made of, e.g., Ti, Ta, Cu or Al may be formed. In this case, in order to prevent a thermal damage to an underlayer already formed on the semiconductor wafer in a previous process, there has been widely used a plasma sputtering method capable of forming a metal film having relatively good characteristics at a low temperature.

For example, Japanese Patent Laid-open Publication No. 2006-148075 describes a film forming apparatus using a plasma sputtering method. FIG. 5 is a schematic configuration view showing an example of a film forming apparatus using a plasma sputtering method. As shown in FIG. 5, a metal target 4 as a source material for a metal film is provided at a side portion of a ceiling within an evacuable processing chamber 2. A mounting table structure 6 for mounting thereon a semiconductor wafer W is provided at a central portion within the processing chamber 2. The mounting table structure 6 includes a mounting table 9 having thereon an electrostatic chuck 8 configured to attract and hold the semiconductor wafer W by applying a high DC voltage. The electrostatic chuck 8 also serves as an electrode 10. A high frequency bias power supply 12 is connected to the electrode 10 in order to attract metal ions ionized by plasma. A transmission plate 14 is provided at the ceiling of the processing chamber 2. The transmission plate 14 is made of, for example, quartz, and a high frequency power passes through the transmission plate 14. An induction coil 18 is provided outside the processing chamber 2. The induction coil 18 is connected to a high frequency power supply 16.

A high frequency power is applied from the induction coil 18 into the processing chamber 2 through the transmission plate 14. A gas such as an Ar gas introduced into the processing chamber 2 is excited into plasma P. Metal particles are ejected from the metal target 4 by colliding the plasma P with the metal target 4. The metal particles are increasingly ionized by the plasma P and attracted to the mounting table 9. Accordingly, a metal film is deposited on the semiconductor wafer W.

In this case, the metal film is also deposited on an inner wall surface of the processing chamber 2 or on surfaces of components within the processing chamber 2 as well as on a surface of the semiconductor wafer W. In order to prevent such unnecessary deposition of the metal film, a protective cover member 20 is provided so as to substantially surround a side surface of the mounting table 9 and a processing space where the plasma P is generated. An insulation gap 22 having a small width is formed between the protective cover member 20 and the side surface of the mounting table 9. The protective cover member 20 is made of a conductive material such as SUS or aluminum, and is connected to a ground side. An unnecessary metal film is deposited on a surface of the protective cover member 20.

However, in the above-described film forming apparatus using the plasma sputtering method, the metal film is deposited not only on the surface of the semiconductor wafer W but also on a periphery of a top surface of the mounting table 9 that is not covered by the semiconductor wafer W and a top surface of the protective cover member 20 surrounding the mounting table 9. As a result, an unnecessary metal film 24 is formed.

If a thickness of the unnecessary metal film 24 is thin, no particular problem may occur. However, as the thickness of the unnecessary metal film 24 is gradually increased, the width of the insulation gap 22 that is set to be, for example, about 1.5 mm becomes substantially narrower. In that case, an electrostatic capacitance of a stray capacitance 26 (refer to FIG. 6) in the insulation gap 22 is significantly increased. Accordingly, a high frequency bias power leaked to the ground side through the stray capacitance is gradually increased, so that a high frequency power applied to the plasma is changed. As a result, uniformity in a film forming process on the semiconductor wafer W is deteriorated, so that a plasma process becomes non-uniform as time passes by.

To be more specific, FIG. 6 is an equivalent circuit showing a high frequency bias power supply side of the plasma film forming apparatus shown in FIG. 5. Here, the plasma P is presented by a parallel circuit of a capacitor C and a resistor R. As described above, since the stray capacitance 26 is generated between the protective cover member 20 (ground side) and the electrode 10(8) (hot side) to which a high frequency power is applied, the electrostatic capacitance of the stray capacitance 26 is changed due to the deposition of the unnecessary metal film. Accordingly, the high frequency bias power leaked to the ground side via the stray capacitance 26 is increased, so that the high frequency bias power applied to the plasma P varies. As a result, uniformity in the plasma process on the semiconductor wafer W is deteriorated, so that the plasma process becomes non-uniform as time passes by.

DISCLOSURE OF THE INVENTION

In view of the foregoing problems, illustrative embodiments provide a mounting table structure and a plasma film forming apparatus capable of maintaining high reproducibility in a plasma process by stably applying a high frequency bias power to plasma.

In accordance with one aspect of an illustrative embodiment, there is provided a mounting table structure that mounts thereon a processing target object on which a metal film is formed by a plasma sputtering process and is surrounded by a protective cover member connected to a ground side with an insulation gap therebetween. The mounting table structure includes a mounting table body, made of a conductive material, for mounting thereon the processing target object and serving as an electrode; a base table, made of a conductive material, disposed below the mounting table body with a gap therebetween in a state insulated from the mounting table body; a support column, connected to the ground side, for supporting the base table; a high frequency power supply line, connected to the mounting table body, for supplying a high frequency bias power to the mounting table body; and a power stabilization capacitor provided between the ground side and a hot side to which the high frequency bias power is applied. Here, an electrostatic capacitance of the power stabilization capacitor may be set to be larger than an electrostatic capacitance of a stray capacitance between the mounting table body and the protective cover member.

In accordance with an illustrative embodiment, even though an unnecessary metal film is deposited on the surface of the protective cover member and the surface of the mounting table body and the insulation gap is substantially narrowed so that the electrostatic capacitance of the stray capacitance between the protective cover member and the mounting table body varies, the variation amount of the electrostatic capacitance of the stray capacitance is absorbed by the power stabilization capacitor 120 having large electrostatic capacitance. Accordingly, it is possible to suppress variation of the high frequency bias power applied to the plasma in a processing space. In this way, since the high frequency bias power can be stably applied into the plasma, non-uniformity of the plasma process is suppressed. Thus, high reproducibility in the plasma process can be maintained.

The power stabilization capacitor may include a multiple number of support rod members each connecting the base table and the mounting table body in an insulated state. Here, an insulating member may be provided at a connection portion where each of the multiple number of support rod members is provided. For example, each of the multiple number of support rod members may include an elongated screw member made of a conductive material.

Further, the electrostatic capacitance of the power stabilization capacitor may be set to be in a range from about 2 to 4 times larger than the electrostatic capacitance of the stray capacitance between the mounting structure body and the protective cover member.

Furthermore, an electrostatic chuck may be provided on a top surface of the mounting table body in order to attract the processing target object.

In accordance with another aspect of an illustrative embodiment, there is provided a plasma film forming apparatus that forms a metal film on a surface of a processing target object by a plasma sputtering process. The plasma film forming apparatus includes an evacuable processing chamber; a mounting table structure having one of the above-described configurations; a protective cover member provided at a periphery of the mounting table structure with an insulation gap and connected to a ground side; a gas inlet unit configured to introduce a gas into the processing chamber; a plasma generator configured to generate plasma within the processing chamber; a metal target as a source material for the metal film; a target power supply configured to supply voltage for attracting ions of the gas toward the metal target; and a high frequency bias power supply configured to supply a high frequency bias power to the mounting table structure.

BEST MODE FOR CARRYING OUT THE INVENTION

Figure 1:
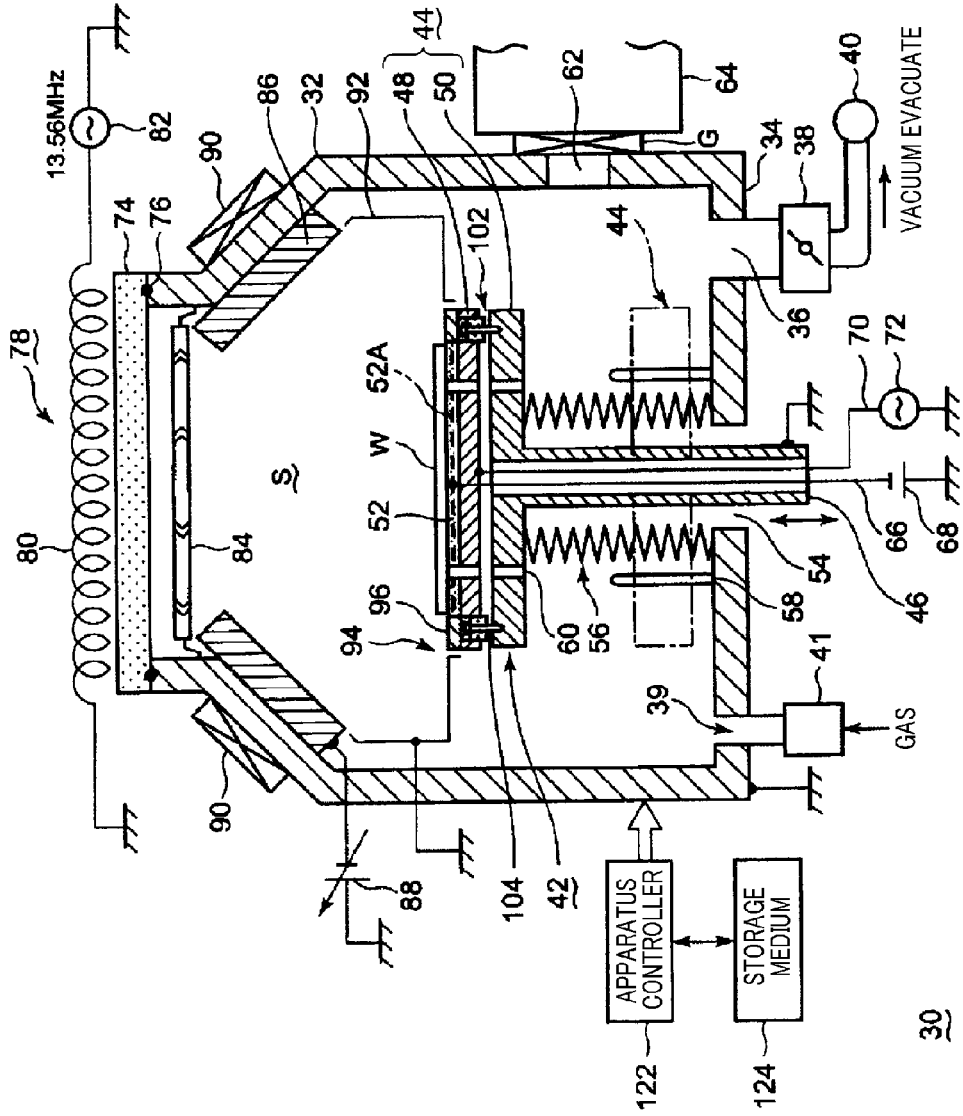
FIG. 1 is a cross sectional view showing an example of a plasma film forming apparatus having a mounting table structure in accordance with an illustrative embodiment.
Figure 2:
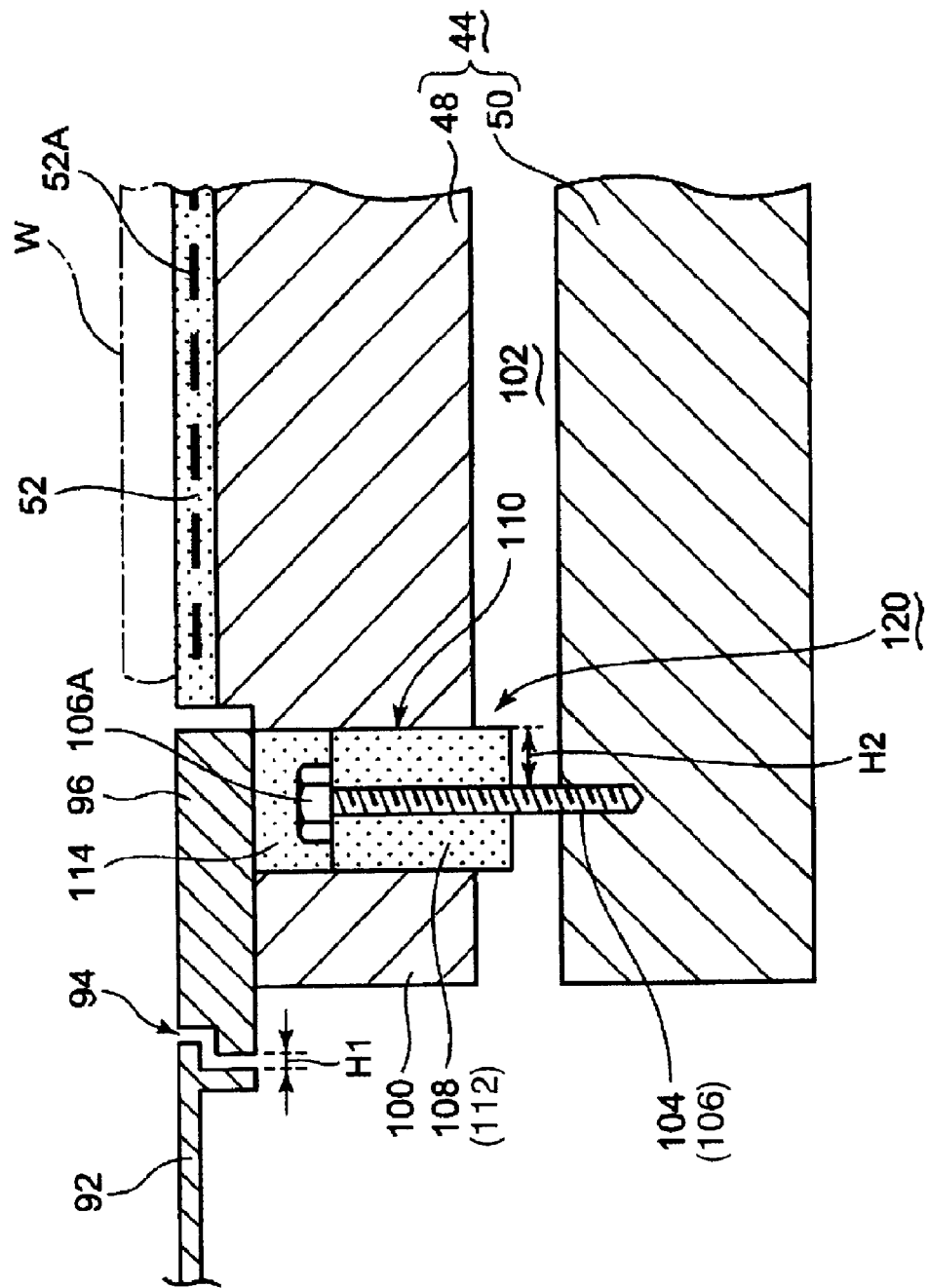
FIG. 2 is a partially enlarged view showing a part of the mounting table structure of FIG. 1.
Figure 3:
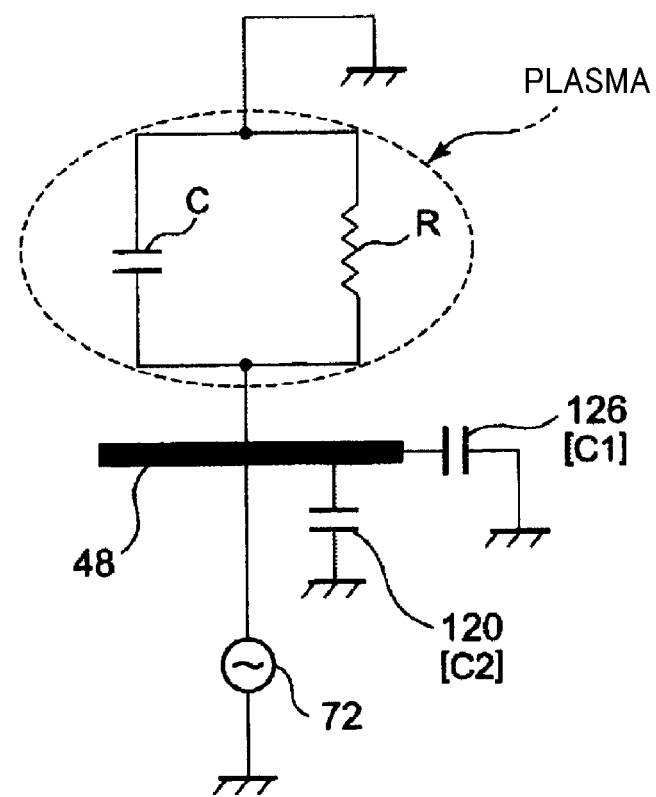
FIG. 3 is an equivalent circuit showing a high frequency bias power supply side of the plasma film forming apparatus of FIG. 1.

Hereinafter, a mounting table structure and a plasma film forming apparatus in accordance with an illustrative embodiment will be described with reference to the accompanying drawings. FIG. 1 is a cross sectional view showing an example of a plasma film forming apparatus having a mounting table structure in accordance with an illustrative embodiment. FIG. 2 is a partially enlarged view showing a part of the mounting table structure of FIG. 1. FIG. 3 is an equivalent circuit showing a high frequency bias power supply side of the plasma film forming apparatus of FIG. 1. Herein, an inductively coupled plasma (ICP) type plasma sputtering apparatus will be described as an example of the plasma film forming apparatus.

As shown in FIG. 1, the plasma film forming apparatus 30 has a cylindrical processing chamber 32 made of, e.g., aluminum. The processing chamber 32 is electrically grounded, and an exhaust port 36 is formed in a bottom portion 34 of the processing chamber 32. The processing chamber 32 is evacuated through the exhaust port 36 by a vacuum pump 40 via a throttle valve 38 for adjusting a pressure. As an example gas inlet unit for introducing a certain gas into the processing chamber 32, a gas inlet 39 is formed in the bottom portion 34 of the processing chamber 32. A plasma excitation gas such as an Ar gas or another gas such as a $N_2$ gas is supplied through the gas inlet 39 via a gas controller 41 including a gas flow rate controller, a valve, or the like.

A mounting table structure 42 for mounting thereon a semiconductor wafer W as a processing target object is provided in the processing chamber 32. The mounting table structure 42 mainly includes a mounting table 44 and a support column 46. The mounting table 44 has a circular plate shape, and the support column 46 has a hollow cylindrical shape. The support column 46 supports the mounting table 44 and is connected to the ground side (i.e., electrically grounded). The mounting table 44 mainly includes a mounting table body 48 and a base table 50. The mounting table body 48 is made of a conductive material such as an aluminum alloy. The base table 50 supports the mounting table body 48 in an insulated state. The mounting table body 48 also serves as an electrode to which a high frequency bias power is applied, as will be described later. The base table 50 is made of a conductive material such as an aluminum alloy. A top portion of the support column 46 is connected to a center of a bottom surface of the base table 50. That is, the base table 50 is also electrically grounded.

An electrostatic chuck 52 is provided on a top surface of the mounting table body 48 having therein a chuck electrode 52A. The electrostatic chuck 52 has a thin circular plate shape and is made of a ceramic material such as alumina. The electrostatic chuck 52 is configured to attract and hold the semiconductor wafer W by an electrostatic force. The connection and support structure between the mounting table body 48 and the base table 50 will be described later.

A lower portion of the support column 46 is extended downward through an insertion through hole 54 formed in a center of the bottom portion 34 of the processing chamber 32. The support column 46 is configured to be vertically movable by a non-illustrated elevating unit, so that the entire mounting table structure 42 can move up and down.

A metallic bellows 56 is provided so as to surround the support column 46. The metallic bellows 56 is extensible and contractible. A top portion of the metallic bellows 56 is airtightly connected to a bottom surface of the base table 50 of the mounting table 44. A bottom portion of the metallic bellows 56 is airtightly connected to the bottom portion 34 of the processing chamber 32. Accordingly, it is possible to vertically move the mounting table structure 42 while maintaining airtightness within the processing chamber 32.

For example, provided at the bottom portion 34 are three support pins 58 (only two support pins are shown in the illustrated example) standing uprightly from the bottom portion 34. Pin insertion through holes 60 are formed in the mounting table 44 so as to correspond to the support pins 58. When the mounting table 44 is moved down, the semiconductor wafer W is received on top portions of the support pins 58 that have passed through the pin insertion through holes 60. The semiconductor wafer W can be transferred between the support pins 58 and a transfer arm (not illustrated) loaded from the outside. A transfer port 62 through which the transfer arm is loaded into or unloaded from the processing chamber 32 is formed in a lower sidewall of the processing chamber 32. An opening/closing gate valve G is provided at the transfer port 62. For example, a vacuum transfer chamber 64 is provided at a side opposite to the transfer port 62 with respect to the gate valve G.

A chuck power supply 68 is connected to the chuck electrode 52A of the electrostatic chuck 52 provided on the mounting table body 48 via a wiring 66, so that the semiconductor wafer W is attracted to and held on the electrostatic chuck 52 by an electrostatic force. A high frequency power supply line 70 is connected to the mounting table body 48. Thus, a high frequency bias power is applied to the mounting table body 48 from a high frequency bias power supply 72 through the high frequency power supply line 70.

A transmission plate 74 is airtightly provided at the ceiling of the processing chamber 32 via a seal member 76 such as an O-ring. The transmission plate 74 is made of a dielectric material such as aluminum oxide and a high frequency power passes through the transmission plate 74. A plasma generator 78 is provided above the transmission plate 74. The plasma generator 78 generates plasma in a processing space S of the processing chamber 32 by exciting as an Ar gas serving as the plasma excitation gas into plasma.

Instead of the Ar gas, an inert gas, e.g., a rare gas such as a He gas or a Ne gas may be used as the plasma excitation gas. The plasma generator 78 has an induction coil 80 provided so as to correspond to the transmission plate 74. A high frequency power supply 82 is connected to the induction coil 80, and the high frequency power supply 82 outputs a high frequency power of, e.g., about 13.56 MHz for plasma generation. Accordingly, a high frequency power can be introduced into the processing space S via the transmission plate 74.

A baffle plate 84 made of, e.g., aluminum is provided directly below the transmission plate 74. The baffle plate diffuses an introduced high frequency power. A metal target 86 is provided below the baffle plate 84 so as to surround an upper region of the processing space S. For example, the metal target 86 has an inwardly inclined annular cross section (i.e., cone shape tapering to a top thereof). The metal target 86 is connected to a variable DC power supply 88 for supplying voltage to attract Ar ions toward the metal target 86. Instead of the DC power supply, an AC power supply may be used.

Provided at an outside of the metal target 86 are magnets 90 for generating a magnetic field. For example, titan (Ti) is used as the metal target 86. The Ti is sputtered by the Ar ions in the plasma to become metal atoms or metal atom groups. While passing through the plasma, most of these Ti atoms or Ti atom groups are ionized. As the metal target 86, one or more elements selected from a group consisting of Ti, zirconium (Zr), hafnium (Hf), niobium (Nb), manganese (Mn), copper (Cu), and tantalum (Ta) may be used.

A cylindrical-shaped protective cover member 92 is provided below the metal target 86 so as to surround the processing space S. The protective cover member 92 is made of, for example, aluminum or copper. The protective cover member 92 is connected to the ground side, i.e., is electrically grounded. A lower portion of the protective cover member 92 is bent inwardly and positioned in a vicinity of a side surface of the mounting table 44.

In this case, an inner end portion of the protective cover member 92 surrounds the mounting table body 48 of the mounting table 44. As shown in FIG. 2, the mounting table body 48 and the inner end portion of the protective cover member 92 are spaced apart from each other with an insulation gap 94 having a small width therebetween. For example, a width H1 of the insulation gap 94 is set to be about 1.5 mm. By providing the protective cover member 92 in this way, an unnecessary metal film is deposited on a surface of the protective cover member 92. Accordingly, it is possible to prevent deposition of an unnecessary metal film on an inner surface of the processing chamber 32 or on surfaces of components within the processing chamber 32.

The connection and support structure between the mounting table body 48 and the base table 50 of the mounting table 44 will be described below with reference to FIG. 2. As aforementioned, the mounting table body 48 is supported by the base table 50 in an insulated state. Specifically, as shown in FIG. 2, a step-shaped portion 100 is formed at a peripheral portion of the mounting table body 48 (i.e., an outer peripheral portion of the electrostatic chuck 52). The step-shaped portion 100 is positioned lower than the electrostatic chuck 52. A circular ring-shaped bias ring 96 is disposed on the step-shaped portion 100, and the bias ring 96 is made of a conductive material such as stainless steel. By using the bias ring 96, metal ions can be uniformly attracted onto an outer peripheral portion of the semiconductor wafer W, as in a central portion of the mounting table 44.

An outer peripheral end of the bias ring 96 has a step shape, and an inner peripheral end of the protective cover member 92 facing the outer peripheral end of the bias ring 96 also has a step shape. Thus, the insulation gap 94 is provided between the outer peripheral end of the bias ring 96 and the inner peripheral end of the protective cover member 92. A power stabilization capacitor 120 in accordance with the illustrative embodiment is provided between the base table 50 and the mounting table body 48. Here, since the high frequency power is applied to the mounting table body 48, the mounting table body 48 serves as the hot side. Meanwhile, since the base table 50 is electrically grounded, the base table 50 serves as the ground side. Specifically, the base table 50 and the mounting table body 48 are spaced apart from each other with a certain interval 102 therebetween, so that the base table 50 is electrically insulated from the mounting table body 48. The power stabilization capacitor 120 includes a multiple number of support rod members 104 that connects the base table 50 and the mounting table body 48 in an insulated state.

The support rod members 104 are provided in the step-shaped portion 100 of the peripheral portion of the mounting table body 48. For example, twelve (12) support rod members 104 (only two support rod members are shown in FIG. 1) are arranged along a circumferential direction of the mounting table body 48 at a same pitch. An insulating member 108 is provided at connection portions with the support rod members 104 so as to cover the whole periphery of the support rod members 104. Specifically, the support rod member 104 includes an elongated screw member 106 made of a conductive material such as stainless steel.

Screw through holes 110 are formed in the step-shaped portion 100 of the mounting table body 48. Each screw through hole 110 has a diameter much larger than a diameter of the screw member 106. An insulating resin 112 as the insulating member 108 is firmly provided so as to be buried in a lower portion of the screw through hole 110. The screw member 106 is screwed from above the insulating resin 112 so as to penetrate the insulating resin 112. Further, a lower portion of the screw member 106 is screwed into the base table 50, so that the mounting table body 48 and the base table 50 are connected to each other. An insulating cap 114 is provided in the screw through hole 110 so as to cover a screw head 106A of the screw member 106. The insulating cap 114 is made of a ceramic material such as alumina. With the above-described configuration, the mounting table body 48 and the base table 50 are connected to each other in an insulated state.

Here, as aforementioned, the mounting table body 48 as an electrode serves as the hot side to which the high frequency power is applied. The base table 50 and the screw member 106 are electrically grounded. Accordingly, a stray capacitance is generated between the screw member 106 and the mounting table body 48 made of the conductive material. Stray capacitances are generated between the mounting table body 48 and all the twelve screw members 106.

In this case, a distance H2 between the screw member 106 and an inner surface of the screw through hole 110 is set to be about 2 mm to about 4 mm. The power stabilization capacitor 120 refers to the total stray capacitance at all the twelve screw members 106 (connection portions). Electrostatic capacitance of the power stabilization capacitor 120 is set to be larger than an electrostatic capacitance of a stray capacitance 126 (refer to FIG. 3) between the mounting table body 48 and the protective cover member 92.

Specifically, the stray capacitance 126 refers to the stray capacitance between the mounting table body 48 and the protective cover member 92. An electrostatic capacitance C2 (refer to FIG. 3) of the power stabilization capacitor 120 is set to be about 2 to 4 times larger, desirably, about 2 to 3 times larger than electrostatic capacitance C1 of the stray capacitance 126 between the mounting table body 48 and the protective cover member 92. If the electrostatic capacitance C2 is set to be smaller than about twice the electrostatic capacitance C1, when the electrostatic capacitance C1 varies, the variation amount may not be sufficiently absorbed (reduced), so that the high frequency bias power applied to the plasma is significantly changed. As a result, the effect in providing the power stabilization capacitor 120 cannot be sufficiently accomplished. On the contrary, if the electrostatic capacitance C2 is set to be larger than about 4 times the electrostatic capacitance C1, the high frequency bias power leaked to the ground side through the power stabilization capacitor 120 is excessively increased.

That is, the support rod members 104 made of a conductive material are provided as the power stabilization capacitor 120 in accordance with the illustrative embodiment. Further, the electrostatic capacitance of the stray capacitance at the support rod members 104 is set to be significantly large as described above. When forming the metal film, an unnecessary metal film is deposited on the surface of the protective cover member 92 or on the surface of the bias ring 96, and the insulation gap 94 (refer to FIG. 2) becomes narrow. As a result, the electrostatic capacitance of the stray capacitance in the insulation gap varies (increases). However, by providing the power stabilization capacitor 120 (i.e., stray capacitance by the support rod members 104 and the insulating member 108) having electrostatic capacitance larger than that of the stray capacitance, the variation amount of the electrostatic capacitance of the stray capacitance can be absorbed by the power stabilization capacitor 120. As a result, the high frequency bias power can be stably applied to the plasma.

An equivalent circuit of the mounting table structure is illustrated in FIG. 3. Plasma is presented as a parallel circuit of a capacitor C and a resistor R. As aforementioned, the stray capacitance 126 is generated between the mounting table body 48 (the electrode) serving as the hot side to which the high frequency power is applied and the protective cover member 92 serving as the ground side. The power stabilization capacitor 120 as a stray capacitance in accordance with the illustrative embodiment is provided between the mounting table body 48 and the ground side.

Referring back to FIG. 1, each component of the plasma film forming apparatus 30 is connected to and controlled by an apparatus controller 122 including, for example, a computer. Specifically, the apparatus controller 122 controls operations of the high frequency bias power supply 72, the high frequency power supply 82 for plasma generation, the variable DC power supply 88, the gas controller 41, the throttle valve 38, and the vacuum pump 40. The plasma film forming apparatus 30 has a storage medium 124 that stores therein computer-readable programs necessary for the control by the apparatus controller 122. The storage medium may be a flexible disc, a compact disc (CD), a hard disc, a flash memory, DVD, or the like.

<Description of Operation>

Figure 4:
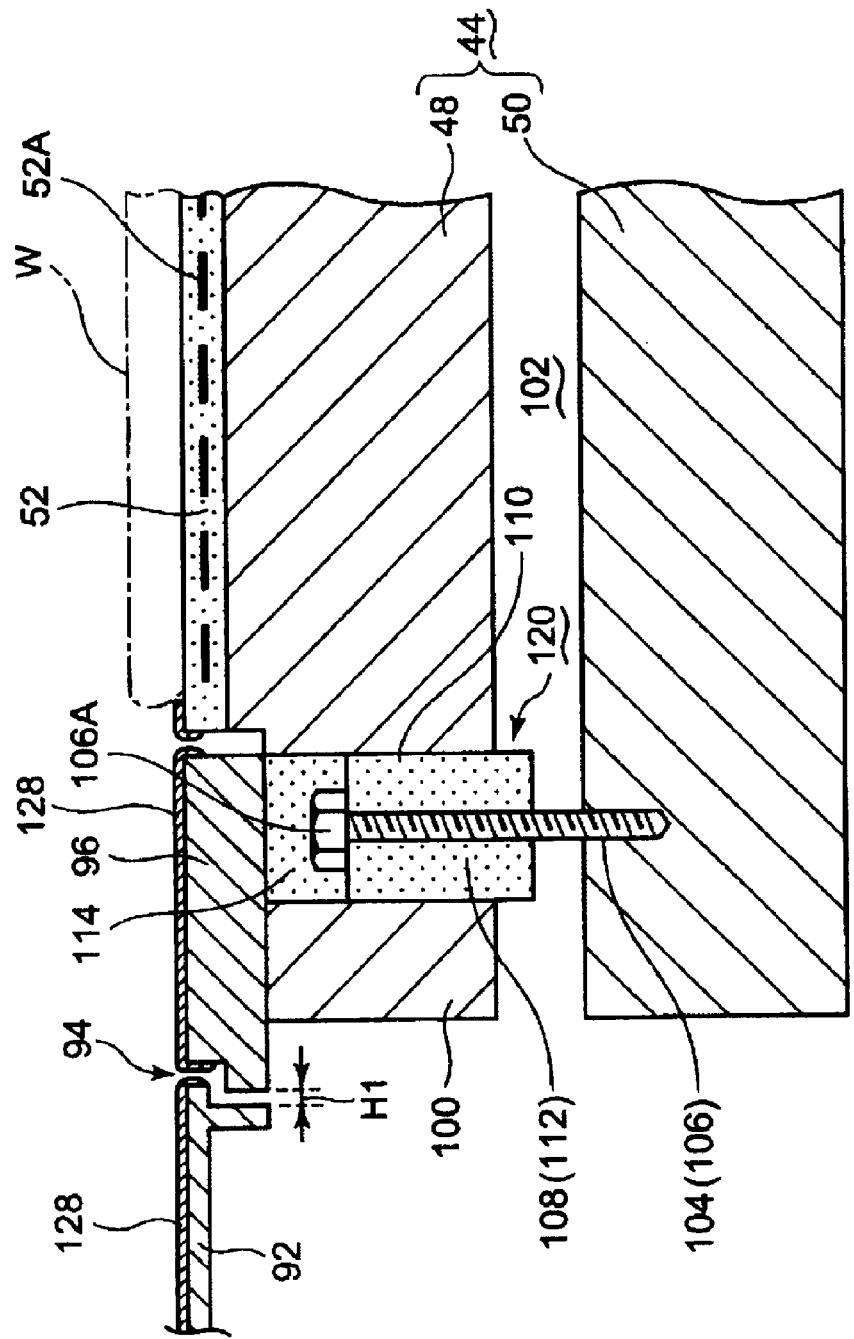
FIG. 4 is a partially enlarged cross sectional view showing when an unnecessary metal film is deposited on a surface of a mounting table of the mounting table structure of FIG. 1.
Figure 5:
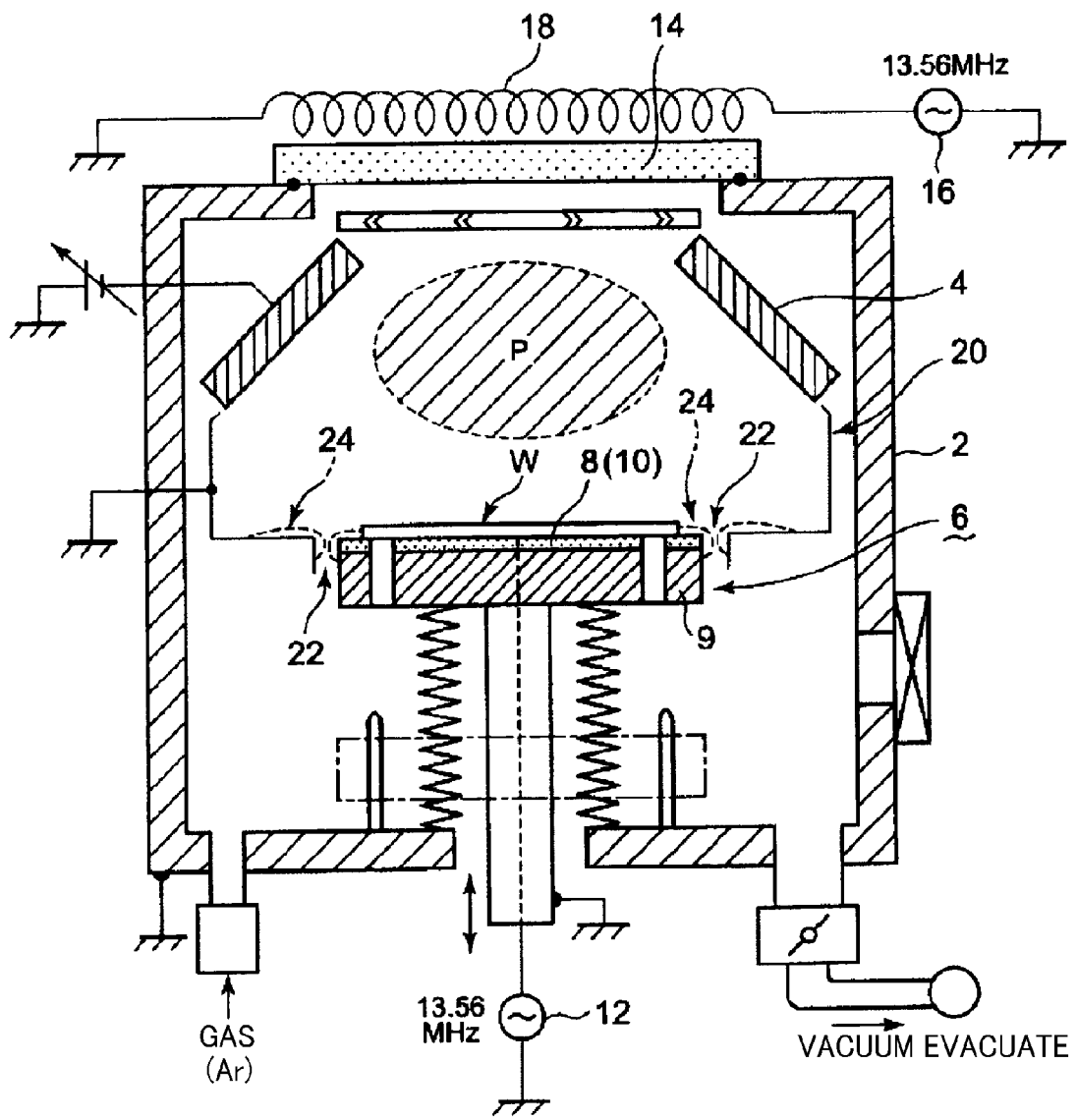
FIG. 5 is a schematic configuration view showing an example of a conventional film forming apparatus using a plasma sputtering method.
Figure 6:
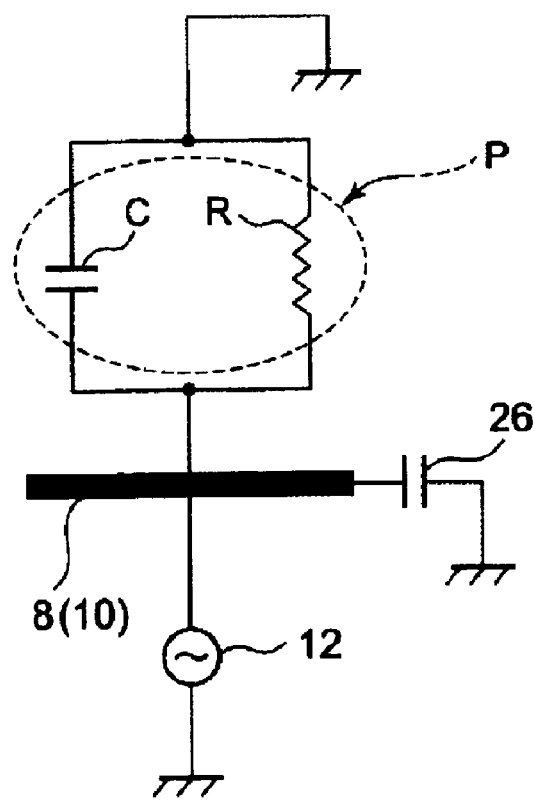
FIG. 6 is an equivalent circuit showing a high frequency bias power supply side of the plasma film forming apparatus of FIG. 5.

Next, an operation of the plasma film forming apparatus configured as described above will be described with reference to FIG. 4. FIG. 4 is a partially enlarged cross sectional view showing when an unnecessary metal film is deposited on a surface of the mounting table of the mounting table structure.

First, under the control of the apparatus controller 122, the processing chamber 32 is evacuated to a certain vacuum level by operating the vacuum pump 40. Then, an Ar gas is flown into the processing chamber 32 by the gas controller 41, and the inside of the processing chamber 32 is maintained at a preset vacuum level by controlling the throttle valve 38. Thereafter, a DC power is applied to the metal target 86 via the variable DC power supply 88. A high frequency power (plasma power) is applied from the high frequency power supply 82 of the plasma generator 78 to the induction coil 80.

The apparatus controller 122 also sends an instruction to the high frequency bias power supply 72, and a high frequency bias power is applied to the mounting table body 48 serving as an electrode of the mounting table structure 42. In the processing chamber 32 controlled as described above, argon plasma is generated by the plasma power applied to the induction coil 80, and argon ions are generated. These argon ions are attracted toward the metal target 86 by the voltage applied to the metal target 86, and the argon ions collide with the metal target 86. As a result, the metal target 86 is sputtered, and metal particles are ejected from the metal target 86.

Most of metal atoms or metal atom groups in the metal particles ejected from the metal target 86 are ionized when passing through the plasma. Here, ionized metal ions and electrically neutral metal atoms are mixed in the metal particles, and these metal particles are dispersed downwardly. Since an internal pressure of the processing chamber 32 is set to be, for example, about 5 mTorr, plasma density is increased. Accordingly, the metal particles can be ionized with high efficiency.

Once the metal ions enter an ion sheath region having a thickness of less than about 10 mm, the metal ions are accelerated and attracted toward the semiconductor wafer W with strong directivity. The ion sheath region is generated on the semiconductor wafer by applying the high frequency bias power to the mounting table body 48 (the electrode). Accordingly, the metal ions are deposited on the semiconductor wafer W, and the metal film is formed.

If the metal film forming process is repeatedly (continuously) performed, as well as on the surface of the semiconductor wafer W mounted on the top surface of the mounting table 44, a small amount of metal film is also deposited on the surface of the bias ring 96 or on the surface of the protective cover member 92 positioned in the vicinity of the semiconductor wafer W, as shown in FIG. 4. That is, an unnecessary metal film 128 is formed. As a result, the width H1 of the insulation gap 94 is gradually narrowed, so that the stray capacitance in the insulation gap 94 is increased. Therefore, the electrostatic capacitance of the stray capacitance between the mounting table body 48 as the hot side to which the high frequency power is applied and the protective cover member 92 as the ground side is gradually increased. As a result, a high frequency power leaked through the insulation gap 94 is increased. In this case, it is concerned that the high frequency bias power applied to the plasma side is greatly changed.

However, in the above-described illustrative embodiment, the power stabilization capacitor 120 includes the insulating member 108 and the screw members 106 as the support rod members 104 for fixing the mounting table body and the base table 50. Accordingly, it is possible to suppress variation of the high frequency bias power applied to the plasma.

That is, in the equivalent circuit of FIG. 3, even when the electrostatic capacitance of the stray capacitance 126 varies due to the unnecessary metal film 128 (refer to FIG. 4), by setting the electrostatic capacitance (total sum of the electrostatic capacitances at the twelve support rod members 104) of the power stabilization capacitor 120 in accordance with the illustrative embodiment to be much larger (about 2 to 4 times larger) than the electrostatic capacitance of the stray capacitance 126, the high frequency bias power leaked through the power stabilization capacitor 120 becomes higher than the high frequency bias power leaked through the stray capacitance 126.

As a result, even when the high frequency bias power leaked through the stray capacitance 126 varies, the corresponding variation amount is absorbed by the high frequency bias power leaked through the power stabilization capacitor 120. Accordingly, it is possible to stably supply the high frequency bias power to the plasma.

That is, by providing the power stabilization capacitor 120 having large electrostatic capacitance, the high frequency bias power leaked to the outside is previously set to have a large value. Accordingly, when the electrostatic capacitance of the stray capacitance 126 varies depending on the formation of the metal film, the variation amount of the high frequency bias power applied to the plasma can be relatively reduced. Thus, it is possible to stably apply the high frequency power to the plasma. In addition, high reproducibility in the plasma process on the semiconductor wafer W can be maintained.

In this case, when the electrostatic capacitance of the stray capacitance 126 between the mounting table body 48 and the protective cover member 92 denotes by "C1," and the electrostatic capacitance of the power stabilization capacitor 120 at all the twelve screw members 106 denotes by "C2," variation amount of "C1" depends on total film forming time, but is about 30% in case of processing, for example, 20 to 30 thousands of wafers. The electrostatic capacitance C2 is set to be in a range of from about 2 to 4 times larger than the electrostatic capacitance C1, as described above. In order to adjust the electrostatic capacitance of the power stabilization capacitor 120, for example, relative permittivity of the insulating resin 112 or a radius of the screw through hole 110 in FIG. 2 is adjusted.

Here, the effect of the mounting table structure of the illustrative embodiment has been verified through an experiment. The experiment conditions are as follows: a diameter of the mounting table body 48 is about 350 mm (corresponding to a semiconductor wafer having a diameter of about 300 mm); and the electrostatic capacitance of the stray capacitance 126 between the mounting table body 48 and the protective cover member 92 is about 2050 pF; twelve support rod members 104 including the screw members 106 made of metal a conductive material are provided; and polyimide having about 3.6 of relative permittivity is used as the insulating resin 112. Under these conditions, an electrostatic capacitance of a stray capacitance at each screw member 106 is about 433 pF. Accordingly, the electrostatic capacitance C2 of the power stabilization capacitor 120 at all the twelve screw members 106 is 433 pF×12≈about 5200 pF. In this case, the electrostatic capacitance C2 is about 2.5 times the electrostatic capacitance C1.

When the metal film forming process is continuously performed until total power reaches about 1000 KWh (corresponding to process for about 20 to 30 thousands of wafers), variation amount ($\Delta$C1) of the electrostatic capacitance C1 is about 640 pF. Accordingly, when the electrostatic capacitance C2 is not provided, the variation amount ($\Delta$C1) is 640/2050=about 31%. However, as in the illustrative embodiment, when the electrostatic capacitance C2 is provided, the variation amount ($\Delta$C1) is 640/(2050+5200)=about 9%. As can be seen from the experiment result, in the illustrative embodiment, a good result can be obtained. In the plasma film forming apparatus, if the variation amount ($\Delta$C1) is suppressed to be within about 10%, variation of reproducibility in film forming process by a plasma sputtering method can be suppressed to be within about 2% to about 3%. From the results, the effect of the illustrative embodiment can be sufficiently verified.

As described above, in accordance with the illustrative embodiment, there is provided a mounting table structure that mounts thereon a processing target object such as a semiconductor wafer on which a metal film is formed by a plasma sputtering process and is surrounded by a protective cover member 92 connected to a ground side with an insulation gap therebetween. The mounting table structure includes a mounting table body 48 for mounting thereon the processing target object and serving as an electrode. Here, a high frequency bias power is applied to the mounting table body 48. The mounting table structure further includes a base table 50, made of a conductive material, disposed below the mounting table body 48 with a gap therebetween in a state insulated from the mounting table body 48. The base table 50 is electrically grounded. The mounting table structure further includes a power stabilization capacitor 120 provided between the ground side and a hot side to which the high frequency bias power is applied. Here, an electrostatic capacitance of the power stabilization capacitor may be set to be larger than an electrostatic capacitance of a stray capacitance between the mounting table body 48 and the protective cover member 92.

As a result, even though the unnecessary metal film is deposited on the surface of the protective cover member and the surface of the mounting table body 48 and the insulation gap is substantially narrowed so that the electrostatic capacitance of the stray capacitance between the protective cover member 92 and the mounting table body varies, the variation amount of the electrostatic capacitance of the stray capacitance is absorbed by the power stabilization capacitor 120 having large electrostatic capacitance. Accordingly, it is possible to suppress variation of the high frequency bias power applied to the plasma in the processing space S. In this way, since the high frequency bias power can be stably applied into the plasma, non-uniformity of the plasma process is suppressed. Thus, high reproducibility in the plasma process can be maintained.

In the illustrative embodiment, although twelve support rod members 104 are provided, the illustrative embodiment is not limited thereto. In the illustrative embodiment, the power stabilization capacitor 120 is provided at the connection portion between the mounting table body 48 and the base table 50. However, the illustrative embodiment is not limited thereto but may be provided at any position between the ground side and the hot side to which the high frequency bias power is applied.

In the illustrative embodiment, although the semiconductor wafer is described as an example of the processing target object, the illustrative embodiment is not limited thereto. By way of example, the semiconductor wafer may include a silicon substrate or a compound semiconductor substrate such as GaAs, SiC, or GaN. Further, the illustrative embodiment is not limited to these substrates but may be applied to a ceramic substrate or a glass substrate used for a liquid crystal display.

What is claimed is:

1. A mounting table structure that mounts thereon a processing target object on which a metal film is formed by a plasma sputtering process and is surrounded by a protective cover member installed within a processing chamber and connected to a ground side with an insulation gap therebetween, the mounting table structure being installed within the processing chamber, the mounting table structure comprising:
    a mounting table body, made of a conductive material, for mounting thereon the processing target object and serving as an electrode;
    a base table, made of a conductive material, disposed below the mounting table body with a gap therebetween in a state insulated from the mounting table body;
    a support column, connected to the ground side, for supporting the base table;
    a high frequency power supply line, connected to the mounting table body, for supplying a high frequency bias power to the mounting table body; and
    a power stabilization capacitor provided within the processing chamber and provided between the base table and the mounting table body,
    wherein the power stabilization capacitor includes: a plurality of screw members made of a conductive material and configured to penetrate the mounting table body; and an insulating member configured to cover a side surface and a top surface of each screw member, and
    the plurality of screw members are fixed to the base table.

2. The mounting table structure of claim 1,
    wherein an electrostatic chuck is provided on a top surface of the mounting table body in order to attract the processing target object.

3. A plasma film forming apparatus that forms a metal film on a surface of a processing target object by a plasma sputtering process, the plasma film forming apparatus comprising:
    an evacuable processing chamber,
    a mounting table structure as claimed in claim 1,
    a protective cover member provided at a periphery of the mounting table structure with an insulation gap and connected to a ground side,
    a gas inlet unit configured to introduce a gas into the processing chamber,
    a plasma generator configured to generate plasma within the processing chamber,
    a metal target as a source material for the metal film,
    a target power supply configured to supply voltage for attracting ions of the gas toward the metal target, and
    a high frequency bias power supply configured to supply a high frequency bias power to the mounting table structure.

* * * * *